United States Patent [19]

Laviron et al.

[11] Patent Number: 4,520,309
[45] Date of Patent: May 28, 1985

[54] SYSTEM FOR TESTING THE MALFUNCTIONING OR CORRECT OPERATION OF A CIRCUIT WITH LOGIC COMPONENTS

[75] Inventors: André Laviron, Fontaine les Dijon; Claude Berard, Is-sur-Tille, both of France

[73] Assignee: Commissariat a l'Energie Atomique, Paris, France

[21] Appl. No.: 355,094

[22] Filed: Mar. 5, 1982

[30] Foreign Application Priority Data

Mar. 11, 1981 [FR] France ................ 81 04868

[51] Int. Cl.³ .................... G01R 31/28
[52] U.S. Cl. ................... 324/73 R
[58] Field of Search ....... 324/73 PC, 73 R, 73 AT; 371/23

[56] References Cited

U.S. PATENT DOCUMENTS

| | | | |
|---|---|---|---|
| 3,777,129 | 12/1973 | Mehia | 324/73 R X |
| 3,789,205 | 1/1974 | James | 324/73 R X |
| 3,790,885 | 2/1974 | James | 324/73 R |
| 3,815,025 | 6/1974 | Jordan | 324/73 R |
| 3,881,260 | 5/1975 | Hombs . | |
| 3,924,181 | 12/1975 | Alderson . | |
| 3,927,371 | 12/1975 | Pomeranz et al. | 324/73 R |
| 3,961,250 | 6/1976 | Snethen . | |
| 4,013,951 | 3/1977 | Ezoe et al. | 324/73 R |
| 4,308,616 | 12/1981 | Timoc | 371/23 |

FOREIGN PATENT DOCUMENTS 2211659 7/1974 France .
WO80/01207 6/1980 PCT Int'l Appl. .

Primary Examiner—Gerard R. Strecker
Attorney, Agent, or Firm—Oblon, Fisher, Spivak, McClelland & Maier

[57] ABSTRACT

The invention relates to a system for testing the malfunctioning or correct operation of a circuit with n logic components. These components respectively present a simulation input receiving a malfunctioning or correct operation simulation signal. The system is characterized in that it comprises test means for placing each component respectively in a state of malfunctioning or of correct operation and vice versa, for one or more combinations of the components of the circuit, the test means present a characteristic output which furnishes a signal of which the logic level depends on the state of malfunctioning or of correct operation and vice versa, of each of the components of the circuit. Finally, the system comprises stop means for stopping the test means when the tests to be carried out are finished. The invention is more particularly applied to tests of electronic circuits and, by analogy, to tests of hydraulic circuits.

1 Claim, 7 Drawing Figures

SYSTEM FOR TESTING THE MALFUNCTIONING OR CORRECT OPERATION OF A CIRCUIT WITH LOGIC COMPONENTS

The present invention relates to a system for testing the malfunctioning or correct operation of a circuit with logic components in which n components form an assembly of components marked from 1 to n in predetermined manner. These components are connected together for this assembly to present, on an output, a logic state which depends on the state of malfunctioning or of correct operation of the assembly and which depends on the state of malfunctioning or of correct operation of each of the n components of the assembly. Each of the components of the assembly presents at least one simulation input which is adapted to receive a signal simulating the malfunctioning or correct operation of this component.

This test system may enable electronic circuits comprising a plurality of logic components to be studied, but it may allow, by analogy, the study of the malfunctioning or correct operation of a hydraulic circuit for example, of which one or more components may be in a state of malfunctioning or of correct operation; in this case, the hydraulic circuit is replaced by an electronic circuit comprising a plurality of logic components whose operation is equivalent, by analogy, to that of the corresponding components of the hydraulic circuit.

A circuit constituted by logic components generally presents an output of which the logic state depends on the state of malfunctioning or of correct operation of each of its components. This circuit may, as has been mentioned hereinabove, either be a real circuit or a circuit simulating a circuit to be studied. Each of the components generally presents an input which is connected to an output of another component of the circuit and another input which may receive a signal simulating the malfunctioning or the correct operation of this component.

Systems which enable circuits of this type to be tested are generally complicated and expensive, and difficult to carry out; they are generally constituted by a computer which is connected to the circuit to be tested via an interface specific to each circuit. This type of system necessitates a program of processing particular to each circuit, with the result that the tests carried out may take a considerable time.

In tests of circuits constituted by logic components, the man skilled in the art generally uses a certain number of terms, as follows:

the cut of a circuit is the set of all the marks of the faulty components of this circuit, such that, if all these components are faulty, the circuit is faulty, the other components of this circuit, which do not form part of the cut, operating correctly;

the link of a circuit is the set of all the marks of the correctly operating components of this circuit, such that, if all these components are operating correctly, the circuit is operating correctly, all the other components of the circuit which do not form part of the link, being faulty.

The order of a cut or of a link is constituted by the number of marks of the components which are respectively malfunctioning or operating correctly which describe the cut or the link;

the minimal cut is a cut such that it is impossible to find another configuration, on eliminating one or more faulty elements from those whose marks describe the cut, which would enable the circuit to be maintained in a state of malfunctioning;

a minimal link is a link such that it is impossible to find another configuration, on eliminating one or more correctly functioning components from those whose marks describe the link, which would enable the circuit to be maintained in a state of correct operation;

the minimal cut with respect to the preceding order is a cut such that it is not possible to find another configuration of this cut, on eliminating the malfunctioning of a single component, from those whose marks describe the cut, whilst maintaining the circuit in a state of malfunctioning;

in the same way, a minimal link with respect to the preceding order is a link such that it is not possible to find another configuration of this link on eliminating the correct functioning of a single component from those whose marks describe the link, whilst maintaining the circuit in a state of correct operation.

In addition to the drawbacks mentioned hereinabove, the known test systems do not make it possible simply to determine whether a cut or a link is minimal with respect to the preceding order. In the following specification, the term "minimal" must be understood as "minimal with respect to the preceding order".

It is an object of the invention to produce a system for testing the malfunctioning or correct operation of a circuit with n components, which overcomes the above-mentioned drawbacks and enables tests to be carried out rapidly, simply, inexpensively and efficiently, on circuits in which a cut or a link has been determined; it also makes it possible to ascertain, simply and rapidly, whether this cut or this link is minimal.

The invention relates to a system for testing the malfunctioning or the correct operation of a circuit with logic components in which n components form a set of components marked from 1 to n in predetermined manner and connected together so that this set presents on an output a logic state which corresponds to the state of malfunctioning or of correct operation of the set, and which depends on the state of malfunctioning or of correct operation of each of the n components of the set, each of the n components of the set presenting at least one simulation input adapted to receive a signal simulating the malfunctioning or correct operation of this component, characterised in that it comprises:

test means whose outputs are respectively connected to the simulation inputs of the components, these test means making it possible to place one or more components into a state of malfunctioning or of correct operation, respectively, then to return, inversely and reciprocally, this or these components into the state of correct operation or of malfunctioning, for one or more combinations from the n components of the set, these test means presenting a characteristic output which, when the output of the set presents a state of malfunctioning or of correct operation corresponding to a state of malfunctioning or of correct operation of the components of the set, furnishes a signal which presents:

a first logic state if the output of the set presents a state of correct operation or a state of malfunctioning, whenever one or more respectively faulty or correctly operating components are returned by the test means respectively into the state of correct operation or of malfunctioning, this for one or more combinations of the components of the set, taken separately, a second logic state, if the output of the set presents a state of correct operation or of malfunctioning, each time one or more respectively correctly operating or faulty components are returned by the test means respectively into the state of malfunctioning or of correct operation, this for one or more combinations of the components of the set, taken separately.

means for stopping the test means.

According to another feature, the set of the marks of the faulty components defining a cut if the circuit is faulty and the set of the marks of the correctly operating components defining a link if the circuit is operating correctly, the order of cut or of link is defined as being respectively the number of marks of the faulty or correctly operating components, the test means comprise storage means comprising a flip flop for storing the results of simulation presenting an initialization control input adapted to receive an initialization control signal for this flip flop to present, at initialization, a predetermined initial logic state corresponding respectively to a minimal cut or a minimal link if this state is restored at the end of the test, these storage means further comprising a logic circuit of which one input is connected to the output of the circuit to be tested and of which one output controls the change of state of the flip flop, so as to obtain on the output thereof the logic state complementary of the predetermined initial state in the case of the output of the circuit to be tested not changing level when the complementary state of a component respectively describing the cut or the link studied is simulated, this for each of the components describing the cut or the link, taken separately, the flip flop remaining in its initial state if the output of the circuit changes state.

According to another feature, the test means comprise a set of at least n flip flops for storing logic simulation states, the outputs of these flip flops being respectively connected to the simulation inputs of the components, the logic states simulating malfunctioning or correct operation of the components of the circuit being set in these flip flops at initialization of the system of the control means, of which control outputs are connected to inputs of a logic assembly for selection and control of the flip flops, for the output of each simulation state storage flip flop selected to present, successively and respectively, the logic state of the flip flop at initialization, the inverse logic state, then the logic state of the flip flop at initialization again.

According to a further feature, the control means comprise a shift register comprising at least n control flip flops connected in series and each presenting a control output, this register further presenting a general return to zero input, a storage input and an input controlling the shift of this signal, the control inputs of the logic selection assembly being connected to the control outputs of the flip flops of the shift register, the outputs of this logic assembly being connected to control inputs of the flip flops of the storage assembly, the logic assembly being constituted so that each flip flop selected to apply a simulation signal on the simulation input of each predetermined component corresponds to the presence of a predetermined logic level on the control output of the corresponding flip flop of the shift register, this logic assembly further comprising two additional control inputs adapted to receive, respectively, test control signals for the output of each selected flip flop to present, successively, the logic state of the flip flop at initialization, the inverse logic state with respect to the initial state, then, again, the initial logic state of this flip flop.

According to a further feature, the test control means further comprise logic synchronization means for producing on outputs the control signals for storing the results of simulation, return to zero signals of the shift register, storage and shift control signals applied to the corresponding inputs of the first flip flop of the register and an initialization control signal applied to the corresponding input of the flip flop for storing the results of simulation.

According to another feature, the system further comprises a counter initially set at the value of the order of the cut or of the link, this counter presenting an input connected to the output of the logic synchronization means which produces the control signals for storing the results of simulation, the contents of this counter decrementing by one unit upon each control signal storing the results of simulation, an output of this counter being connected to a control input for stopping the synchronization means in order to stop the system when all the components have been tested.

According to another feature, an output of the flip flop for storing the results of simulation is connected on the one hand to means for indicating that the cut or the link is not minimal and on the other hand to the synchronization means stop control input to stop the system when the cut or the link is not minimal.

According to a further feature, the logic control assembly comprises two AND gate assemblies each comprising a number of gates equal to the number n of flip flops $P_i$ and to the number n of flip flops $L_i$, each of these gates corresponding to a flip flop $L_i$ and to a flip flop $P_i$, each AND gate of the first assembly presenting an input connected to a control output of the corresponding flip flop of the shift register and another input connected to the output of the synchronization means in order to receive one of the test control signals, the output of this flip flop being connected to one of the control inputs of the flip flop $P_1$ of the assembly P to pass it into the state inverse with respect to its initial state, each AND gate of the second assembly presenting an input connected to a control output of the corresponding flip flop $L_1$ of the shift register and another input connected to the output of the synchronization means for receiving another of the test control signals, the output of this AND gate being connected to another of the control inputs of the corresponding flip flop $P_1$ of the assembly to return this flip flop into its initial state.

According to a further feature, the logic control and selection assembly further comprises a third logic assembly of AND gates, each AND gate presenting an input connected to the control output of the corresponding flip flop $L_i$ of the shift register and another input connected to the output of the corresponding flip flop $P_i$ of the storage assembly, the outputs of these AND gates being connected to the inputs of an OR gate of which the output is connected to another control input of the synchronization means to indicate the presence of a logic simulation state on an output of a flip flop $P_i$ selected from the storage assembly.

According to another feature, the flip flops $P_i$ for storing logic simulation states are grouped in identical assemblies on identical modules connected in series, each of these modules comprising a shift register so that the shift registers are connected in series, the output of the last flip flop for storing logic simulation states of one module being connected to the loading input of the first flip flop of the following module, the first flip flop $L_1$ of the first shift register presenting the storage, return to zero and shift control inputs, whilst the control output of the last flip flop of a shift register is connected to the storage input of the following shift register, the logic control and selection assembly further comprising, for each module, a third assembly of AND gates, each AND gate presenting an input connected to the control output of the corresponding flip flop $L_i$ of the shift register of this module, and another input connected to the output of the corresponding flip flop $P_i$ of the corresponding assembly P, the outputs of these AND gates for each module being connected to the inputs of an OR gate of which the output is connected to another control input of the synchronization means, via a transistor mounted as an open collector, to indicate the presence of a logic simulation state on an output of a flip flop $P_i$ selected from a storage assembly of one of the modules.

The invention will be more readily understood on reading the following description with reference to the accompanying drawings, in which:

FIG. 1A schematically shows a hydraulic circuit of which it is desired to study the state of malfunctioning or of correct operation in the event of malfunctioning or of correct operation of one or more of its components.

FIG. 1B schematically shows the circuit of FIG. 1A, in which have been added, on each of the components of the circuit, means for simulating malfunctioning or correct operation of each of the components.

Figure 3:
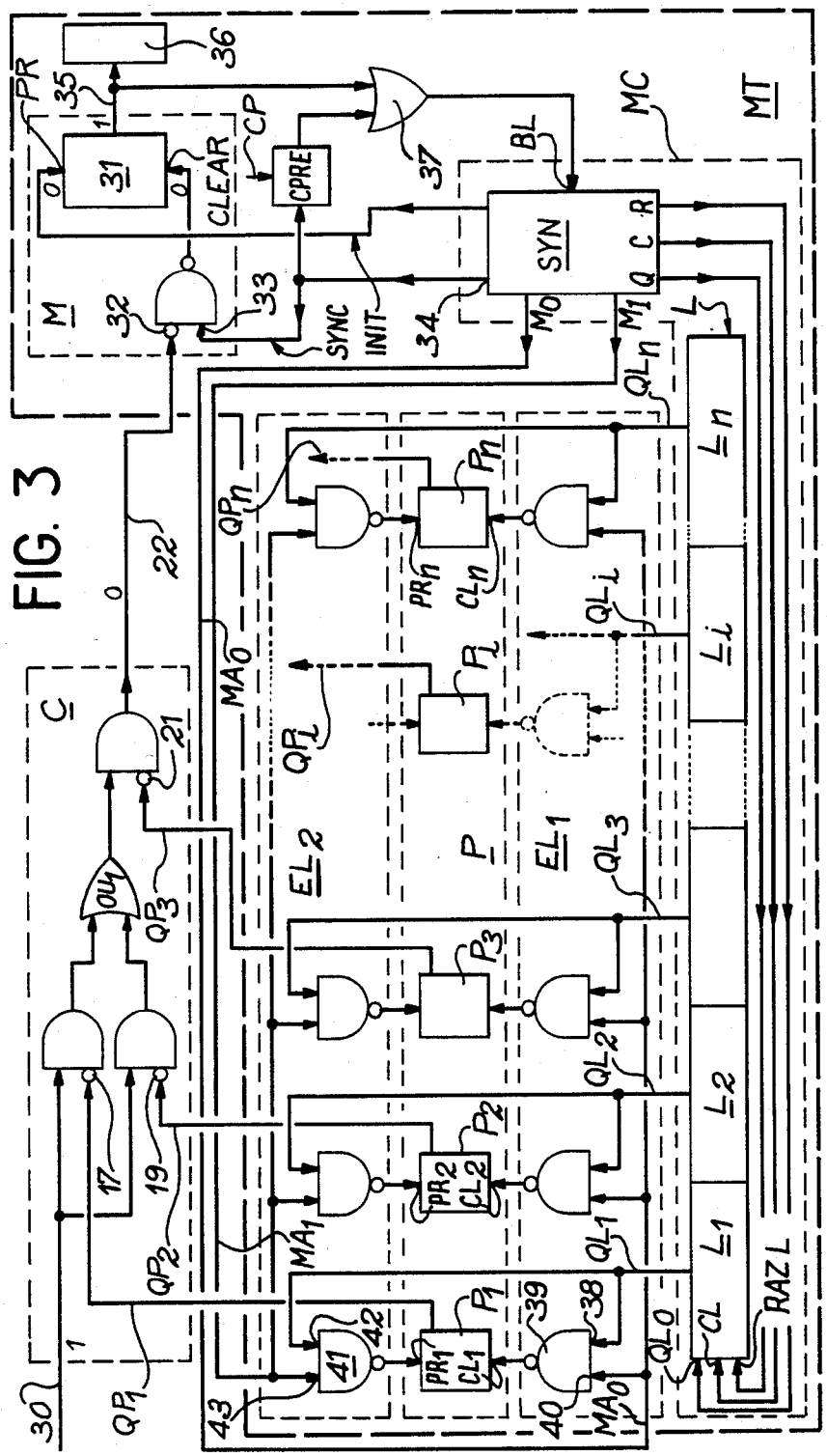

FIG. 3 schematically shows the system according to the invention.

Figure 4:
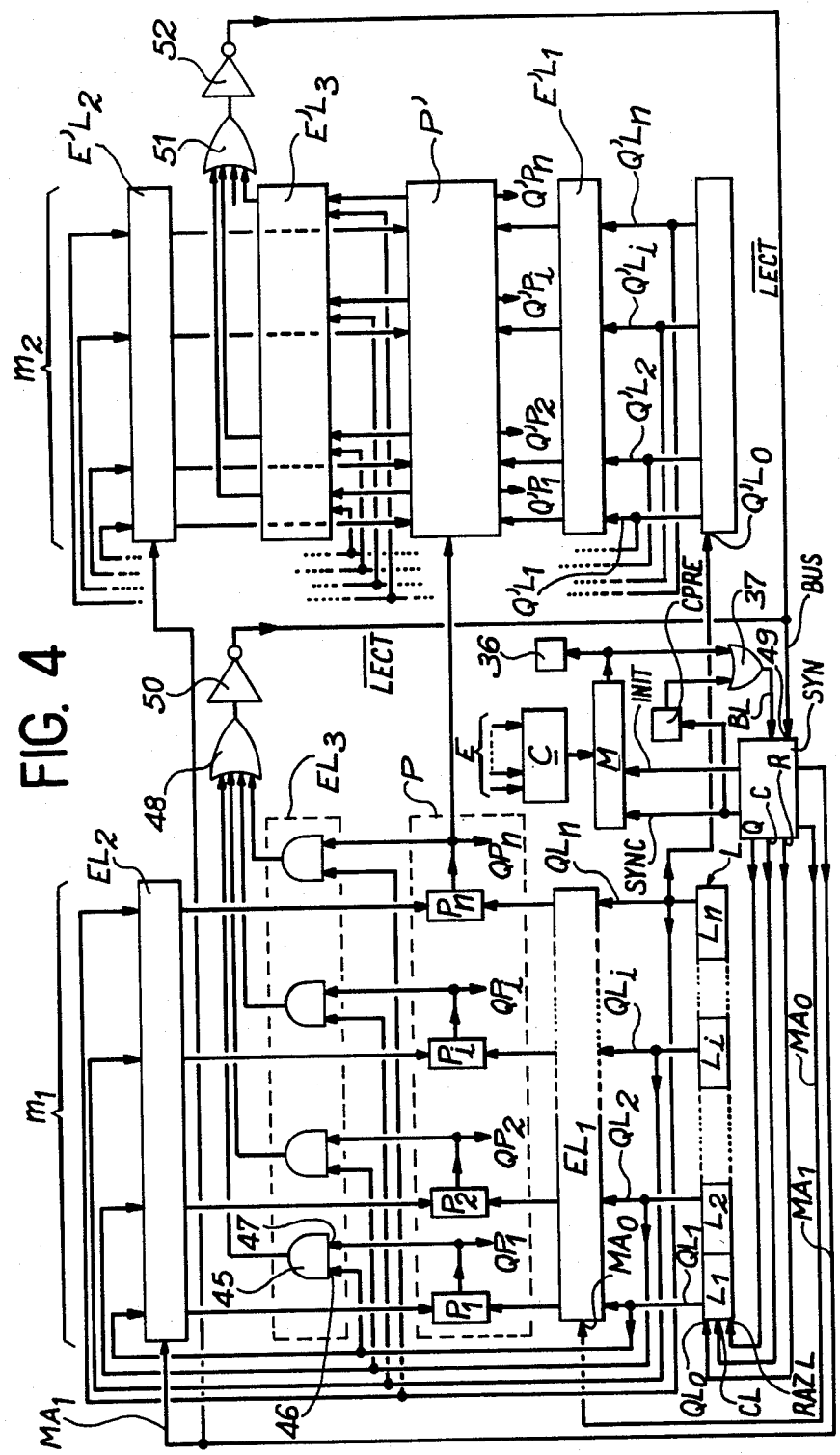

FIG. 4 schematically shows the system of the invention, in modular form.

Figure 5:
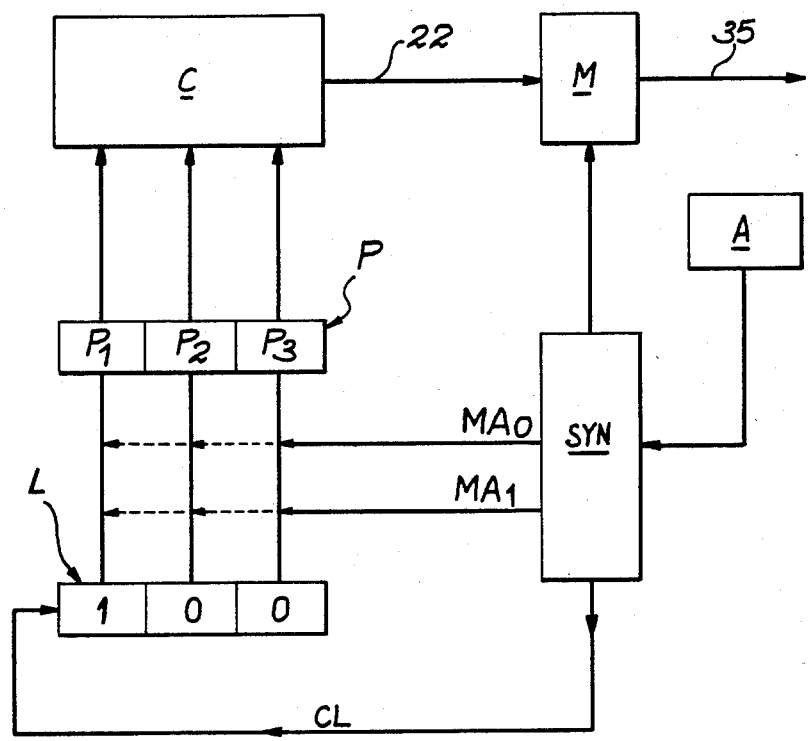

FIG. 5 is a simplified diagram of the system of FIG. 3, for studying a cut with 3 components, in a circuit C.

Figure 1A:
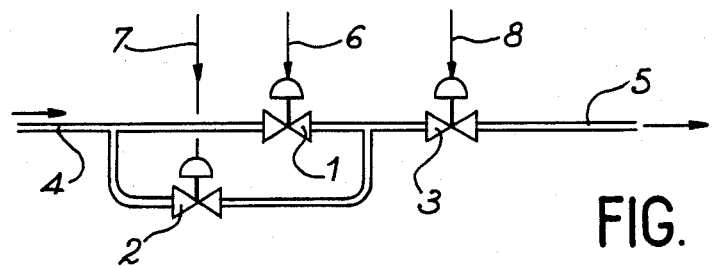

Referring now to the drawings, FIG. 1A schematically shows a hydraulic circuit which establishes, for example, circulation between an upstream pipe 4 and a downstream pipe 5, due to three pneumatic valves 1,2,3 whose opening or closure may be controlled by the presence or absence of compressed air in the control conduits 6, 7, 8. In this circuit, the valves constitute the only components which may either be in a state of malfunctioning or in a state of correct operation. The hydraulic circuit in question is faulty if the fluid is not transmitted into the downstream pipe 5. When only valves 1 and 2 are faulty, the fluid no longer passes from upstream pipe 4 towards downstream pipe 5; the same applies when valves 1 and 3 are faulty. This results in the set of marks 1 and 2 constituting a cut and, similarly, in the set of marks 1 and 3 also constituting a cut. In this circuit, according to the definitions which have been given above, the cut constituted by marks 1 and 2 (AND gates $ET_1$, $ET_2$) is a cut of order 2; the same applies to cut 1,3. The cut 1,2 is minimal as, if component 1 is returned to correct operation, the system returns to correct operation; the same applies to component 2. On the other hand, cut 1,3 is not minimal as, if component 1 is returned to correct operation, the system remains faulty.

When only valves 1 and 3 are operating correctly, the fluid passes from upstream to downstream, so that the set of marks 1 and 3 constitutes a link. This link is, moreover, a minimal link of order 2 since it is impossible to find another configuration, on eliminating the correct operation of one of these two valves, which enables the circuit to be maintained in a state of correct operation.

Figure 1B:
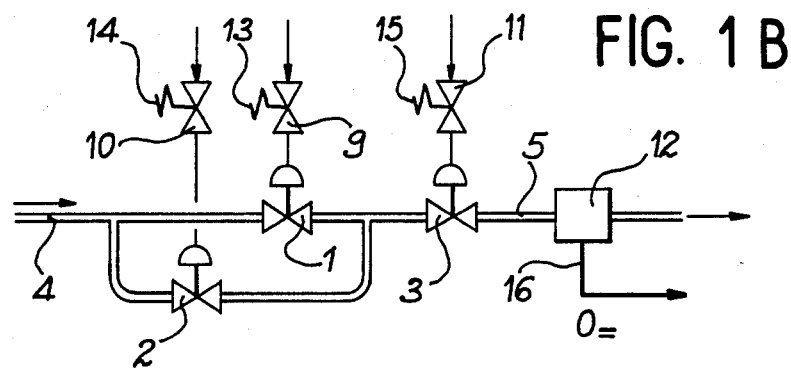

FIG. 1B schematically shows the circuit of the preceding Figure in which have been added, for each of the valves 1,2,3, in the control conduits 6,7,8 thereof, means 9,10, 11 which simulate the state of malfunctioning or correct operation of these valves. A detector 12 for detecting passage of fluid may be disposed in the downstream pipe 5 to indicate for example, by a logic state 0, on its output 16, the malfunctioning of the hydraulic circuit when a fluid furnished at upstream pipe 4 is not found in the downstream pipe 5. The means 9,10,11 for simulating malfunctioning of the valves which correspond thereto respectively present control inputs 13,14,15. These means are respectively constituted, for example, by an electrically controlled valve which acts on the pneumatic control of each of the valves 1,2,3 of the circuit. The control input of each of the electrically controlled valves acts so that, if a voltage is applied to this input, this valve closes and cuts off the compressed air arriving in the control conduit of the corresponding valve of the hydraulic circuit. This stopping of the arrival of compressed air simulates malfunctioning of the corresponding valve in the circuit. This malfunctioning being simulated, it then suffices to observe the output signal from the fluid passage detector 12 to know whether or not this malfunctioning interrupts passage of the fluid towards the outlet of the hydraulic circuits.

Figure 2A:
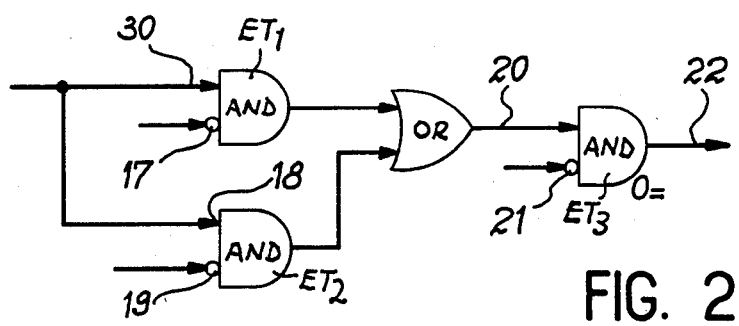
FIG. 2A is a logic circuit equivalent to the hydraulic circuit of FIG. 1B, enabling the cuts of this circuit to be studied.

FIG. 2A shows a logic circuit equivalent to the hydraulic circuit of FIG. 1B; this equivalent circuit makes it possible to study the cuts of the hydraulic circuit, i.e. its response to the simulated malfunctionings. In this equivalent circuit, the valve 1, as well as the electrically controlled valve 9, which simulates the malfunctioning of the valve 1, are replaced by the AND gate $ET_1$, a direct input 30 of this gate is taken to a logic level 1, to simulate the arrival of the fluid in the upstream pipe of the hydraulic circuit and an inverted input 17 is taken to a logic state of level 1, to simulate malfunctioning of this circuit. In the same way, the AND gate $ET_2$ is equivalent to the valve 2 associated with the electrically controlled simulation valve 10. A logic state of level 1 on the input 18 of this gate simulates the passage of the fluid, whilst a logic state of level 1, on the inverse input 19, simulates the malfunctioning of this gate. Finally, the AND gate $ET_3$ is equivalent to the valve 3 and to the electrically controlled simulation valve 11. The direct input 20 of this gate, taken to a logic state 1, simulates the passage of the fluid, whilst the inverse input 21, taken to a logic state 1, simulates the malfunctioning of this gate. The OR gate $OU_1$ is equivalent to the interface between the outputs of the valves 1 and 2. This circuit equivalent to the hydraulic circuit of FIG. 1B is considered in a state of malfunctioning when the output 22 of the AND gate $ET_3$ is at a logic level 0. It is seen that, due to this equivalent circuit, it is possible to study the cuts of the hydraulic circuit shown in FIG. 1B, in a much simpler manner.

Figure 2B:
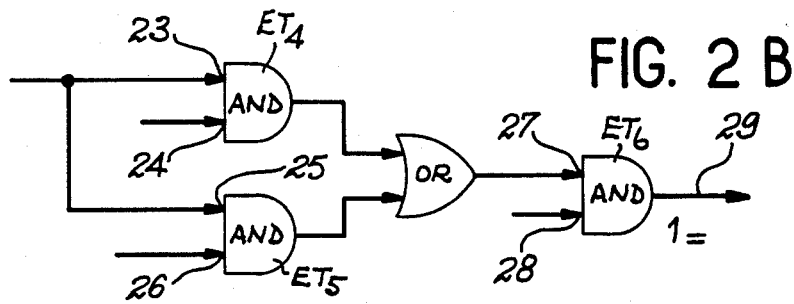
FIG. 2B is a logic circuit equivalent to the hydraulic circuit of FIG. 1B, enabling the links of this circuit to be studied.

The circuit of FIG. 2B is a logic circuit equivalent to the hydraulic circuit of FIG. 1B and it studies the links of this circuit. In the same way as beforehand, the valves 1,2,3, as well as their electrically controlled simulation control valves 9,10,11, are respectively replaced by the AND gates ET$_4$, ET$_5$ and ET$_6$. The OR gate OU$_2$ represents the interface between the outputs of the valves 1 and 2. As before, the AND gates ET$_4$, ET$_5$ and ET$_6$ present inputs 23, 25, 27 which, when they are taken to a logic level 1, simulate the passage of the fluid in the hydraulic circuit. The inputs 24, 26, 28 of these gates make it possible to simulate the correct operation of each of the valves when they are taken to a logic level 1. When the circuit is in a state of correct functioning, the output 29 of the AND gate ET$_6$ is at a logic level 1. In this way, this logic circuit equivalent to the hydraulic circuit of FIG. 1B enables the links of this hydraulic circuit, i.e. its state of correct operation, as a function of the state of correct operation of each of its components, to be studied.

As will be seen hereinafter in greater detail, the test system according to the invention makes it possible to apply for example to each of the malfunctioning or correct operation simulation inputs of the AND gates of FIGS. 2A and 2B, signals simulating the correct operation or malfunctioning of each of these gates and storing at the output the state of malfunctioning or of correct operation of the circuit, in the course of simulation of each component of the circuit corresponding to the cut or to the link which it is desired to study.

FIG. 3 schematically shows a system for testing the malfunctioning or correct operation of a circuit C with n logic components, marked from 1 to n in predetermined manner. The circuit C shown as example in this Figure is the same as that of FIG. 2A. This circuit is equivalent to the circuit of FIG. 1B and enables the cuts of this circuit to be studied. The components which it simulates are constituted by the AND gates ET$_1$, ET$_2$ and ET$_3$. As indicated hereinabove, the input 30 of this circuit is taken to a logic level 1 to simulate the passage of the fluid in the corresponding hydraulic circuit. The output of this circuit is shown at 22, whilst the simulation inputs of the different components are referenced 17, 19, 21. The presence of a logic level 0 on the output 22 of this circuit indicates the malfunctioning thereof.

It is obvious that, in the example of the circuit C shown in this Figure, the system of the invention makes it possible to test a cut on a circuit constituted by three components, but that it might enable a cut to be tested on a circuit comprising a number n of components much greater than 3.

It is also obvious that other components, assumed not to be malfunctioning in the study, may be simulated in the circuit C; this is the case for example of the OR gate OU$_1$. With the circuit C as is described, several cuts may be studied: for example the cut simulating malfunctioning on inputs 17, 19, 21; the cut simulating malfunctioning on inputs 17, 19; the cut simulating malfunctioning on input 21, or the cut simulating malfunctioning on inputs 17, 21, etc.

Finally, the system which will be described in its application to the test of the components of a cut in a circuit, such as the circuit of FIG. 2A, may be applied in the same way to the test of the components of a link in a circuit such as the circuit of FIG. 2B.

In the example shown in the Figure, the outputs QP$_1$, QP$_2$, QP$_3$ of the test means MT are respectively connected to the simulation inputs 17, 19, 21 of the AND gates ET$_1$, ET$_2$, ET$_3$ of the circuit C. These test means, which will be described hereinafter in greater detail, apply to the set of the components describing a cut, logic signals of level 1 simulating their malfunctioning and logic levels 0 simulating correct operation of the other components, then successively to each component describing the cut, a logic signal of level 0 simulating the state of correct operation of this component followed by a return to logic level 1, in order to observe whether or not, at the output of the circuit, the return to the state of correct operation of one of the components maintains the circuit in a state of malfunctioning. If, at the end of these tests, the circuit has been returned at each test, into a state of correct operation, the cut studied is minimal. The test system also comprises storage means M, connected to the output 22 of the circuit for storing the state of malfunctioning or of correct operation of this circuit, in the course of simulation of the various components of a cut thereof. These storage means comprise a flip flop 31 which stores the results of simulation of the various components of the cut studied. This flip flop, well known in the state of the art, comprises in particular control inputs PR and CLEAR. The input PR makes it possible to place this flip flop at logic level 1, at initialization of the system, by application on this input of a logic signal of logic level 0. The input CLEAR enables this flip flop to be placed at the logic level 0, by applying a signal of logic level 0 on this input. As will be seen in greater detail hereinafter, the signal applied to the input PR of the flip flop 31, at initialization of the system, is furnished by logic synchronization means SYN. The input CLEAR of the flip flop 31 is connected to the output 22 of the circuit C, via a logic circuit constituted by an AND gate ET$_8$ with inverted input, of which an input 32 reverses the level of the logic signal coming from the output 22 of the circuit C. The other input 33 of the AND gate ET$_8$ is connected to an output of the test means MT and more precisely to an output 34 of the synchronization means SYN which apply to this gate an impulse synchronization signal SYNC, of logic level 1, whenever a simulation signal is applied to a component. The input CLEAR of the flip flop 31 is a control input for storing the results of simulation.

If a minimal cut is studied, the flip flop 31 remains at an initial logic level 1 in the course of simulation of the various components. As has been indicated above, the three components ET$_1$, E$_2$, ET$_3$ of the circuit C of FIGS. 2A and 3 do not constitute a minimal cut. The circuit C shown in these Figures is equivalent to the hydraulic circuit of FIG. 1B; the arrival of the fluid at the inlet of the hydraulic circuit is simulated by a signal of logic level 1, applied to the input 30 of the circuit C. If a cut in circuit C, or a similar circuit, is studied, the malfunctioning of this circuit is translated by a signal of logic level 0 on the output 22 thereof. The result of this is that a cut studied in circuit C is minimal if the inverted output of the AND gate ET$_8$ is always returned to a logic level 1 when the components which describe the cut are returned, successively and separately, into a state of correct operation, then into a state of malfunctioning. (This is the case for example of the cut constituted by the components ET$_1$, ET$_2$ of the circuit C). If the cut is minimal, the output 35 of the flip flop 31 remains at a logic level 1. If, on the contrary, during simulation of one of the components of the circuit C, which translates the correct operation of this component, the output 22 of the circuit C remains at a logic level 0, the output of the AND gate ET$_8$ passes to a level 0 at the moment of application of the signal SYNC and the output 35 of the flip flop 31 passes to a logic level 0; this logic level 0 on the output 35 of the flip flop 31 indicates that, in the course of simulation of the different components, the passage from a state of malfunctioning to a state of correct functioning of one of the components has maintained the circuit C in a state of malfunctioning and that the cut is thus not minimal. In the course of the tests, the test means MT make it possible to apply to the assembly of the simulation inputs of the components corresponding to the cut, a logic level 1 simulating a malfunctioning, then, successively, the simulation input of each component is taken to a logic level 0 simulating the state of correct operation of this component, then to a logic level 1 simulating a state of malfunctioning again; the simulation inputs of the other components corresponding to the cut are, for the duration of the simulation of a component, at a logic level 1 simulating malfunctioning thereof.

It is obvious that the same arrangement of signals may enable the links on the circuit shown in FIG. 2B to be studied.

The test means MT comprise an assembly P of which at least n flip flops $P_1$, $P_2$, $P_3$, $P_i$ ... $P_n$ store the logic simulation states of the components of the cut to be studied. The outputs $QP_1$, $QP_2$ ... $QP_i$ ... $QP_n$ of these flip flops are, as has been mentioned hereinabove, respectively connected to the simulation inputs of the components of the circuits C. In the example in question, the outputs $QP_1$, $QP_2$, $QP_3$ are thus respectively connected to the simulation inputs 17, 19, 21 of the components of circuit C. In this case, the studied cut is of order 3.

As will be seen in greater detail hereinafter, the logic states for simulation of malfunctioning or correct operation of the components of circuit C which constitute a cut, are set in these flip flops, at initialization of the system. The test means MT also comprise control means MC of which outputs $QL_1$, $QL_2$, $QL_3$ ... $QL_i$ ... $QL_n$ are connected to inputs of a logic assembly $EL_1$, $EL_2$ for selection and control of flip flops $P_i$, for the outputs of these storage flip flops $P_i$, selected to simulate the determined components of the circuit, to present firstly the logic state 1 to simulate a malfunctioning in the case of a cut, then for each output to present successively the reverse logic state (zero) (simulating correct operation of the corresponding component) then again the initial logic state 1 of the flip flop.

As will be seen in greater detail hereinafter, these changes in logic state on the outputs of the selected flip flops $P_i$ are controlled by signals $MA_0$, $MA_1$ coming from the synchronization means SYN; these signals are respectively applied to the logic assemblies $EL_1$ and $EL_2$. The control means MC comprise a shift register L as well as the synchronization means SYN mentioned above. The shift register L comprises at least n control flip flops $L_1$, $L_2$ ... $L_i$ ... $L_n$ which are connected in series. The outputs $QL_1$ ... $QL_i$ ... $QL_n$ of these flip flops constitute control outputs of the assembly P for storing logic simulation states. The first flip flop $L_1$ of the shift register L presents three inputs respectively connected to the outputs R, Q, C of the synchronization means SYN; this flip flop thus receives a signal RAZL for returning to zero the contents of the shift register, a signal $QL_0$ presenting a predetermined logic state which is stored, before shift, in the flip flop $L_1$ of the register, and a clock signal CL which controls the shifts in the register L of the signal $QL_0$ initially stored in the flip flop $L_1$. The control inputs of the logic selection assembly $EL_1$, $EL_2$ are respectively connected to the control outputs $QL_1$ ... $QL_i$ ... $QL_n$ of the flip flops $L_1$ ... $L_i$ ... $L_n$. The outputs of this logic assembly are connected to control inputs $PR_1$ ... $PR_i$ ... $PR_n$, $CL_1$ ... $CL_i$ ... $CL_n$ of the flip flops of assembly P. The logic assembly $EL_1$, $EL_2$ is constituted so that each flip flop $P_i$, selected from the storage assembly P to apply a simulation signal on the simulation input of a predetermined component of a cut of circuit C, corresponds to the presence of a predetermined logic level (level 1) on the control output $QL_i$ of the corresponding flip flop $L_i$. This logic assembly further presents two additional control inputs adapted to receive respectively the test control signals $MA_0$, $MA_1$, for the output of each flip flop $P_i$ selected to successively present the logic state of the flip flop at initialization (logic state 1), the logic state inverted with respect to the initial state (logic state 0), then the initial logic state 1 of this flip flop again, (in the case of studying a cut).

The logic synchronization means SYN produce on their outputs control signals SYNC for storing the results of simulation, the signals RAZL for returning the shift register L to zero, as well as the storage and shift control signals $QL_0$ and CL applied to the first flip flop of the register L. These synchronization means also produce on an output a signal INIT which initializes the logic state of the flip flop 31 storing the results of simulation. In the example described, the signal 0, at initialization of the system, may set the flip flop 31 at level 1.

The system also comprises a counter CPRE which is set by an input CP, at initialization, at a value corresponding to the order of the cut or link (value equal to 3 if the cut constituted by the components $ET_1$, $ET_2$, $ET_3$ is considered). This counter presents an input which is connected to the output 34 of the synchronization means SYN to receive the control signal SYNC for storing the results of simulation. The contents of this counter thus decrease by one unit for each storage control signal SYNC, received on its input. One output of this counter is connected, as will be seen in greater detail hereinafter, to an input BL for controlling the stop of the synchronization means SYN to stop the system when all the components of the cut have been simulated.

Finally, the output 35 of the flip flop 31 for storing the results of simulation is connected on the one hand to means 36 for indicating that the cut or the link is not minimal, and, on the other hand, to the stop control input BL for the synchronization means, via an OR gate OU 37, to stop the system when the cut or the link is not minimal. The means 36 may be constituted for example by a luminous pointer. The cut or the link is not minimal when the output 35 which was at level 1 passes to level 0.

The logic selection and control assembly comprises two AND gate assemblies $EL_1$, $EL_2$ each presenting an inverted output. These two assemblies each comprise respectively a number of gates equal to the number n of flip flops $P_i$ of the assembly P as well as to the number n of flip flops $L_i$ of the shift register L. Each AND gate with inverted output of the first logic assembly $EL_1$ presents an input which is connected to a control output of the corresponding flip flop $L_i$ and another input which is connected to the output $M_0$ of the synchronization means for receiving the test control signal $MA_0$.

Thus, for example in the Figure, the input 38 of the first gate 39 of the assembly $EL_1$ is connected to the output $QL_1$ of the register L, whilst the other input 40 of this gate receives the test control signal $MA_0$, coming from the synchronization means SYN. The outputs of the gates of this first logic assembly are respectively connected, after inversion, to one of the control inputs $CL_1 \ldots CL_i \ldots CL_n$ of the flip flops $P_i$ of the assembly P. The flip flops of the assembly P are set at initialization of the system. The signal $MA_0$ of logic level 1 which, after passage in each gate of the assembly $EL_1$, becomes a signal of logic level 0, is successively applied on the control inputs $CL_1$, $CL_2$, $CL_3$ of the flip flops of assembly P and passes these flip flops to the logic state 0, if their initial state was 1.

Similarly, each AND gate with inverted output of the second logic assembly $EL_2$ presents an input which is connected to a control output of the corresponding flip flop $L_i$ of the shift register L, and another input which is connected to the output $M_1$ of the synchronization means SYN, to receive the test control signals $MA_1$. The inverted outputs of these AND gates of the second logic assembly are respectively connected to the other control inputs $PR_1 \ldots PR_i \ldots PR_n$ of the flip flops of the assembly P to return these flip flops into their initial state (logic level 1) in the course of the tests, due to signals $MA_1$.

The first AND gate 41 of this second logic assembly for example thus presents an input 42 which is connected to the first control output $QL_1$ of the shift register L, and another input 43 which receives a signal $MA_1$ of logic level 1 when the flip flop must be returned into its initial logic state, i.e. logic state 1.

The storage flip flops $P_i$ of the logic simulation state storage assembly P may for example be the flip flops of the assembly P of the combined logic signal generator described in Applicants' Patent Application No. 81 01392 filed on Jan. 26, 1981.

In this case, the flip flops were initially set due to this combination generator so that a predetermined arrangement of certain of them corresponding to the cut or the link studied presents on its outputs logic signals of level 1.

In the test system which has just been described, successive flip flops of the assembly P correspond to each of the components which describes the cut or the link. It is obvious that other flip flops $P_k$ may be inserted between the flip flops $P_i$ to act on other components (not shown) of which the marks do not correspond to those of the cut or the link studied.

It is thus possible to obtain an assembly P of flip flops, arranged from 1 to n, in which n represents the total number of the components of a circuit.

During the simulations of the different components of the circuit C of which it is desired to study a cut, the output 22 of this circuit is at logic level 0 if the latter is malfunctioning.

In the course of the simulations of the various components of a cut of circuit C, if it appears that by placing one of the components in a state of correct operation by application of a signal of logic level 0 on the malfunction input of this component, the malfunctioning of the circuit C is conserved, the output of this circuit remains at logic level 0. At the moment of application of the pulse SYNC on the AND gate $ET_8$, a signal of logic level 0 appears at the output of this gate which provokes passage of the storage flip flop 31 to logic state 0. This change then indicates that the cut studied was not a minimal cut.

The system functions differently when seeking a minimal cut, depending on whether the marks of faulty components and therefore the positions of the logic levels 1 on the outputs of the storage assembly P are known or whether these marks as well as the positions of logic levels 1 on the outputs of the storage assembly P are unknown. At initialization of the system and in both cases, the outputs of the register P for storing the logic simulation state, which are connected to the simulation inputs of the components of circuit C, are at a logic level 1 for all the components corresponding to the cut and at a logic level 0 for all the other components. If the study is that of a cut, a logic state 0 is present on the output 22 of this circuit. If this cut is minimal, the successive simulations of states of correct operation on each of the simulation inputs of the three components of the cut must all provoke the appearance of a signal of logic level 1 on the output 22 of this circuit. The components $ET_1$, $ET_2$, $ET_3$ of circuit C do not constitute a minimal cut.

In fact, the return to state of correct operation of only one of the components of the circuit (for example $ET_3$) maintains the circuit itself in a state of malfunctioning, and the cut is not minimal.

This results in that the test system of the invention operating as follows, in the case of the circuit C shown by way of example in the Figure and in the case of the cut $ET_1$, $ET_2$, $ET_3$, of order 3, being studied: The simulation inputs 17, 19, 21 of the AND gates $ET_1$, $ET_2$, $ET_3$ being initially at a logic level 1 simulating malfunctioning of these components, the input 17 of the AND gate $ET_1$ will be taken to a logic level 0, simulating the state of correct operation of this gate, the other simulation inputs of the other two gates remaining at a logic level 1. The simulation of the state of correct operation of the AND gate $ET_1$ changes nothing on the output 22 of the circuit C, which remains at logic state 0 and therefore changes on the output 35 of the storage flip flop 31 which passes to logic state 0, at the moment of pulse SYNC.

These tests result in the cut constituted by the components $ET_1$, $ET_2$, $ET_3$ of the circuit C not being a minimal cut since the return into state of correct operation of one of the components describing the cut changes nothing in the state of malfunctioning of this circuit. The same operations may of course be carried out on a circuit representing a link, similar for example to that of FIG. 2B or on any cut of the circuit C. Thus, the cut of order 2, constituted by the components $ET_1$, $ET_2$, is a minimal cut. In fact, if $ET_3$ is correctly operating, and $ET_1$ and $ET_2$ are malfunctioning, the circuit C is malfunctioning; if correct operation of $ET_1$ is then simulated, the output of the circuit C passes into a state of correct operation (logic level 1) which does not provoke change on the output 35 of the storage flip flop 31 at the moment of the SYNC pulse. The component $ET_1$ is then returned into state of malfunctioning. If correct operation of the component $ET_2$ is then simulated, the circuit C passes into a state of correct operation, which does not provoke change on the output 35 of the flip flop 31. The component $ET_2$ is then returned into state of malfunctioning. The two components describing the cut having been tested by returning the circuit into correct operation, the cut is therefore minimal, which is translated by a level I at the output 35 of the flip flop 31.

In the embodiment of the system of the invention shown in this Figure, it has been assumed that the marks and therefore the positions of the flip flops of assembly P which are at a level 1, are known.

In this case, at initialization, the storage flip flop 31 is placed at 1, and the register L is returned to zero by a return to zero signal applied to the input RAZL of the register L, thus controlling the return to zero of all the flip flops $L_i$. A storage signal of logic level 1 is then applied on the storage input $QL_0$ of the shift register L, at the same time as a pulse CL provoking a placing of the first flip flop $L_1$ into logic state 1, all the other flip flops of the shift register L being at logic level 0. This operation is the one which enables a single logic level 1 to be inserted in the register L, in the flip flop $L_1$. This operation makes it possible, via the first flip flop of the logic assembly $EL_1$ and the first flip flop of the logic assembly $EL_2$, to simulate the first component of the circuit C by applying the signal $MA_0$ on the input 40 of the gate 39 which causes the output $QP_1$ of the flip flop $P_1$ of the assembly P to pass to logic level 0, thus simulating the correct operation of the first component $ET_1$. If this simulation of correct operation allows a logic level 0 representing malfunctioning of this circuit to appear on the output 22 of circuit C, the cut was not minimal and it is then not necessary to make other simulations.

On the contrary, if this simulation of correct operation of component $ET_1$ returns the output of circuit C into state of correct operation, another shift pulse is applied to the input CL of the shift register L, whilst the input $QL_0$ is taken to logic level 0. This new pulse applied to input CL of the shift register propagates the level 1 which was contained in the flip flop $L_1$ in flip flop $L_2$ to allow simulation of component $ET_2$ via flip flop $P_2$.

It is obvious that this level is propagated up to flip flop $L_i$ of the shift register L, to allow simulation of the component of row i via the flip flop $P_i$.

It is obvious that if the components of order 1 describing the cut do not correspond to successive flip flops $P_i$, the level 1 must be propagated in register L opposite each of the flip flops P corresponding to the components describing the cut.

Of course, after simulation of correct operation of the component $ET_1$, the flip flop $P_1$ of assembly P is returned to the initial state of level 1 due to the application of signal $MA_1$ on the first gate of the logic assembly $EL_2$, the flip flop $P_1$ having been placed at 0 by application of the signal $MA_0$ on the first gate of the logic assembly $EL_1$. The application of the signals $MA_0$ and $MA_1$ is repeated a number of times equal to that of the components which constitute the cut. If, at the end of all these operations, the storage flip flop 31 has remained at logic state 1, the cut was minimal, as has been indicated above.

FIG. 4 schematically shows two other embodiments of a system according to the invention. One of these embodiments concerns the case of the position of the flip flops of the storage assembly P which are at a logic level 1, being unkown. Another embodiment, which is shown in the same Figure, concerns the case of the position of the flip flops of the assembly P which are at level 1, being unknown; the system is constructed in modular form. Like elements bear the same references in this Figure and in the preceding Figure.

In the embodiment shown in the left-hand part of the Figure, the system of the invention comprises, as before, the flip flops $P_1, P_2 \ldots P_n$ of the storage assembly P which deliver on their outputs the signals $QP_1, QP_2 \ldots QP_i \ldots QP_n$. It also comprises the logic assembly $EL_1$ and $EL_2$ which receives the signals $MA_0$ and $MA_1$ which make it possible to control the changes of logic states of the predetermined outputs of the flip flops of assembly P; it also comprises the shift register L, formed by the flip flops $L_1, L_2 \ldots L_i \ldots L_n$ which respectively receives on its inputs a storage signal $QL_0$, shift control signals CL, and a return to zero signal RAZL.

This Figure also shows the synchronization means SYN which control the shift register L, which furnish the signals $MA_0$ and $MA_1$ as well as the signals SYNC and INIT which control the counter CPRE. The means M for storing the resulsts of simulation of circuit C are also shown; this circuit receives on its inputs E the signals from predetermined outputs coming from the flip flops of the assembly P. The OR gate 37, connected to the counter CPRE as well as to the output of the means M for storing the results of simulation, furnishes the signal BL for inhibiting the synchronization means SYN, as has been mentioned hereinabove.

Finally, the means indicating that the cut or the link is not minimal are shown at 36.

In this embodiment, the system functions in the same way as beforehand, except concerning the selection of the flip flops of the storage assembly P; this selection makes it possible to simulate circuit C, on its inputs E. In fact, if the flip flops $P_i$ corresponding to the components describing the cut are at level 1 enabling the inputs of the circuit C to be simulated, and are mixed with flip flops $P_k$ at a level 0, and if the position of the flip flops $P_i$ of the assembly P is unknown, it is necessary to control this shift register L differently from what has been described hereinabove.

In this case, the logic control assembly further comprises a third logic AND gate assembly $EL_3$; each of these gates presents an input which is connected to the control output of the corresponding flip flop $L_i$ in the shift register L and another input which is connected to the output of the corresponding flip flop $P_i$, in the storage assembly P. The AND gate 45 of the logic assembly $EL_3$ thus for example presents an input 46 which is connected to the output $QL_1$ of the flip flop $L_1$ of the shift register L, and an input 47 which is connected to the output $QP_1$ of the flip flop $P_1$ of the assembly P. The outputs of the gates of the logic assembly $EL_3$ are connected to the inputs of an OR gate 48, of which the output is connected to an input 49 of the synchronization means SYN, via an amplifier-inverter 50. The output of this amplifier applies a signal $\overline{LECT}$ to the input 49 of the synchronization means SYN, under conditions which will be defined hereinafter.

In this embodiment, the system functions as follows: a single logic level 1 is always propagated in the register L. To ascertain for example whether the logic state of the flip flop $P_m$ of row m included between 1 and n, is 1, a logic level 1 is propagated in the register L up to flip flop $L_m$. The corresponding AND gate of the logic assembly $EL_3$, of which the inputs are respectively connected to the output $QP_m$ of the flip flop $P_m$ and to the output $QL_m$ of the flip flop $L_m$ of the shift register L, validates transmission of the logic output level 1 of the flip flop $P_m$, towards the circuit SYN, due to a signal $\overline{LECT}$ then appearing on the output of the amplifier-inverter 50 which is connected to the input 49 of the synchronization means SYN. These synchronization means trigger, upon reception of the signal $\overline{LECT}$, validation of the signal $MA_0$ then that of signal $MA_1$, these signals are successively applied on the AND gates with inverted output, which correspond to the flip flop $P_m$, in the logic assembly $EL_1$ and $EL_2$.

Initially, the flip flops $P_i$ of which the outputs correspond to the cut or to the link to be studied, are taken to logic level 1, for example with the aid of the combined logic signal generator described in the patent application mentioned above. The flip flop of the means M for storing the results of simulation is set by a logic level 1, whilst the counter CPRE is set with the order of cut, i.e. 3, in the example of cut of order 3 described hereinabove, comprising the AND gates $ET_1$, $ET_2$, $ET_3$. A logic level 1 is then injected on input $QL_0$ of the flip flop $L_1$ after the shift register L has been returned to zero by a return to zero signal applied on its input RAZL. If the signal $\overline{LECT}$ is at logic level 0, the flip flop $P_1$ corresponding to the flip flop $L_1$ of the shift register presents a logic level 1 on its output $QP_1$.

In the contrary case, pulses CL are applied to the shift control input of the shift register L; each of these pulses is followed by a test of signal $\overline{LECT}$. If, following a test, this signal is at level 1, a new pulse is sent to input CL of the shift register, until the signal $\overline{LECT}$ is at logic level 0, thus indicating the presence of a logic level 1 on an output of a flip flop of the storage assembly P which corresponds to the flip flop which is at level 1 in the register L. Whenever a logic level 1 is found on an output $QP_i$ of the storage assembly P, the signals $MA_0$ and $MA_1$ are successively applied to the inputs of the logic assemblies $EL_1$ and $EL_2$. All these operations are repeated until the counter CPRE which was initially set at the value of the order of the cut, is at zero.

In fact, when this counter is at zero, all the components of the cut or the link have been simulated. The cut is then minimal if the storage flip flop of the assembly M has remained in the logic state 1. The same operations would be effected in the case of a link such as that shown by way of example in FIG. 2B.

FIG. 4 also shows another embodiment of the system of the invention; in this embodiment, the system functions in the following manner. The system is here made in modular form and only two modules $m_1$ and $m_2$ have been shown in this Figure, but it is obvious that it would be possible to associate a larger number of modules. The storage flip flops $P_i$ are grouped in identical assemblies P, P' ... connected in series, so that the last flip flop $P_n$ of the first module $m_1$ is connected to the input of the first flip flop of the assembly P' of the second module $m_2$. The modules comprise shift registers L, L' ... which are identical. The shift register of the first module $m_1$ in particular comprises the storage, return to zero and shift control inputs $QL_0$, RAZL and CL, whilst the control output $QL_n$ of the last flip flop of the shift register L of the first module $m_1$ is connected to the storage input $Q'L_0$ of the shift register L' of the following module. The modules $m_1$ and $m_2$ respectively comprise first, second and third logic assemblies $EL_1$; flip flops of the storage assembly P' of the second module $m_2$ are shown at $Q'P_1$, $Q'P_2$ ... $Q'P_i$ ... $Q'P_n$. The control outputs of the shift register L' of this second module are shown at $Q'L_1$ ... $Q'L_i$ ... $Q'L_n$; they are connected to the inputs of the logic assemblies $E'L_1$, $E'L_2$, $E'L_3$. The outputs of the third logic assembly $E'L_3$ of the second module $m_2$ are connected to the inputs of an OR gate 51, of which the output is connected to the control input 49 of the synchronization means SYN via the amplifier-inverter 52, comparable to the amplifier-inverter 50 and via the line BUS.

Also as before, the output of the amplifier 52 furnishes a signal $\overline{LECT}$ whenever a level 1 is found on an output $Q'P_i$ of a flip flop $P_i'$ of the assembly P', due to the presence of a level 1 on the corresponding output $Q'L_i$ of a flip flop $L_i'$ of the shift register L'.

In fact, this modular construction makes available a large number of simulation signals when a cut C comprising a very large number of components is to be studied. Each of the amplifiers 50 and 52 is constituted by a transistor mounted as an open collector (known in the state of the art and described in the Patent Application mentioned hereinabove).

FIG. 5 schematically shows, in simplified manner, the test system of FIG. 3. This Figure shows the circuit C for which it is desired to study a cut constituted by three components. The simulation inputs of these components are respectively connected to the outputs of the flip flops $P_1$, $P_2$, $P_3$ of the storage assembly P. All these flip flops are placed at logic level 1, to simulate a failure of the three components simultaneously. As it is question of a cut, the output 22 of the circuit C is in a logic state indicating malfunctioning, i.e. in logic state 0, as indicated hereinabove (FIG. 3).

To know whether this cut is minimal with respect to the preceding order, the system functions as follows.

The shift register L is set by a single logic level 1, in first position, by the synchronization means SYN. The output 35 of the storage means M is initialized at logic level 1. The synchronization means SYN, due to signal $MA_0$, place the flip flop $P_1$ which is located opposite the first flip flop of the register L which is at a logic level 1, at zero. If the output 22 of the circuit C passes to a logic level which indicates correct operation of this circuit, i.e. at logic level 1, the output 35 of the storage means M remains at logic level 1. In the contrary case, the output 35 of the storage means M passes to logic level 0 and the test may be stopped by the stop means A, as the cut is not minimal. The means A which have not been described here in detail, comprise in particular the counter CPRE and the OR gate 37 (FIG. 3). If the test is not terminated, the synchronization means SYN return the flip flop $P_1$ to logic level 1 by the signal $MA_1$. The same process is then repeated by shifting the logic level 1 in the register L and the same test is carried out from the storage flip flop $P_2$ then, in the same way, from the storage flip flop $P_3$.

When all the components describing the cut are tested, without stoppage by passage to logic level 0 of the output 35 of the storage means M, the stop means A stop the test. The output 35 of the storage means M then presents a logic level 1 which indicates that the cut is minimal. The functioning which has just been described may be repeated in the same way, replacing the word "cut" by the word "link" and the word "malfunction" by the term "correct operation".

If it is desired to study, on the same circuit C, a cut comprising only two components (for example components 1 and 3), there are two solutions: It is possible to connect the output of the flip flop $P_1$ to the component 1 and the output of the flip flop $P_2$ to component 3, then to operate as described hereinabove.

It is also possible to leave the simulation inputs of the components 1, 2, 3 respectively connected to the outputs of the flip flops $P_1$, $P_2$, $P_3$ and to maintain the output of the flip flop $P_2$ permanently at logic level 0 in order to simulate correct operation of component 2. When the system is operating, instead of proceeding with one shift of level 1 in the register L only, shifts are made up to flip flop $P_i$ of row i corresponding to the following components described by the cut. In the example considered, the level 1 contained in the register L would be positioned successively opposite the flip flops $P_1$, then $P_3$.

It is obvious that, in the system which has just been described, the means used could have been replaced by equivalent means without departing from the scope of the invention.

What is claimed is:

1. A system for testing the operation of a circuit having n components and an output, said system comprising:

storage means having a first input connected to the output of said circuit, a second input and an output;

a set of at least n flip flops, each having an output and at least one input, each of said ouputs being connected as an input to a corresponding one of said n components;

a logic assembly for selection and control of the flip-flops having at least n segments each of said segments corresponding to one of said n flip flops, each of said segments having an output connected to the input of the corresponding flip flop, a first input and two control inputs;

a shift register containing at least n stages connected in series, each of said stages corresponding to one of said flip flops and one of said segments and having an output connected to the first input of the corresponding segment, said shift register having a return to zero input, a signal input and a shift input;

a logic synchronization means having first and second outputs connected to said two control inputs of each segment of said logic assembly, third, fourth and fifth outputs connected to said return to zero input, said signal input and said shift input of first stage of said shift register, a sixth output connected to the second input of said storage means and an input connected to the output of said storage means;

wherein a signal to said input to said component causes said component to malfunction and wherein said synchronization means produces a logic pattern within said shift register through said signal input, causing selected ones of said segments and said flip flops to receive an input signal, and selected ones of said components to malfunction, said synchronization means changing the output of one segment at a time through said two control inputs so that the state of malfunctioning of the corresponding component is changed, the storage means producing a signal on said output to indicate a change in the output of the circuit in response thereto.

* * * * *